United States Patent
Carson et al.

(10) Patent No.: US 8,129,832 B2
(45) Date of Patent: Mar. 6, 2012

(54) MOUNTABLE INTEGRATED CIRCUIT PACKAGE SYSTEM WITH SUBSTRATE HAVING A CONDUCTOR-FREE RECESS

(75) Inventors: Flynn Carson, Redwood City, CA (US); In Sang Yoon, Ichon-si (KR); SeongMin Lee, Seoul (KR); JoHyun Bae, Seoul (KR)

(73) Assignee: Stats Chippac Ltd., Singapore (SG)

( * ) Notice: Subject to any disclaimer, the term of this patent is extended or adjusted under 35 U.S.C. 154(b) by 670 days.

(21) Appl. No.: 11/927,646

(22) Filed: Oct. 29, 2007

(65) Prior Publication Data
US 2009/0108428 A1    Apr. 30, 2009

(51) Int. Cl.
H01L 23/48    (2006.01)
(52) U.S. Cl. .. 257/686; 257/777; 257/723; 257/E23.156
(58) Field of Classification Search .................. 257/686, 257/E23.01, 723, 777, 778, 678, E23.08, 257/E23.169
See application file for complete search history.

(56) References Cited

U.S. PATENT DOCUMENTS

| | | | |
|---|---|---|---|
| 6,861,288 B2 | 3/2005 | Shim et al. | |
| 7,557,443 B2 * | 7/2009 | Ye et al. | 257/723 |
| 2005/0090050 A1 * | 4/2005 | Shim et al. | 438/200 |
| 2006/0244157 A1 | 11/2006 | Carson | |
| 2007/0045803 A1 | 3/2007 | Ye et al. | |
| 2007/0181990 A1 | 8/2007 | Huang et al. | |

* cited by examiner

*Primary Examiner* — Cuong Q Nguyen
*Assistant Examiner* — Tran Tran
(74) *Attorney, Agent, or Firm* — Mikio Ishimaru

(57) ABSTRACT

A mountable integrated circuit package system includes: providing a carrier; mounting a first integrated circuit device over the carrier; mounting a substrate over the first integrated circuit device with the substrate having a conductor-free recess; connecting a first electrical interconnect under the conductor-free recess electrically connecting the carrier and the first integrated circuit device; and forming a package encapsulation over the carrier, the first integrated circuit device, the first electrical interconnect, the conductor-free recess, and partially exposing the substrate.

18 Claims, 3 Drawing Sheets

US 8,129,832 B2

MOUNTABLE INTEGRATED CIRCUIT PACKAGE SYSTEM WITH SUBSTRATE HAVING A CONDUCTOR-FREE RECESS

TECHNICAL FIELD

The present invention relates generally to integrated circuit package system and more particularly to an integrated circuit package system having an encapsulation.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages, package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages with stacking configurations, or PIP, may also present problems. Spacer structures may be used to create space for electrical connections in the stacked structure. Package structures contain packaged integrated circuits in the stacked structures. Typical spacer structures and the encapsulation material of the packaged integrated circuits have low adhesion and become a source of delamination. Conventional spacer and packaged integrated circuits interface perform poorly in reliability test from the delamination at this interface.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system includes: providing a carrier; mounting a first integrated circuit device over the carrier; mounting a substrate over the first integrated circuit device with the substrate having a conductor-free recess; connecting a first electrical interconnect under the conductor-free recess electrically connecting the carrier and the first integrated circuit device; and forming a package encapsulation over the carrier, the first integrated circuit device, the first electrical interconnect, the conductor-free recess, and partially exposing the substrate.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
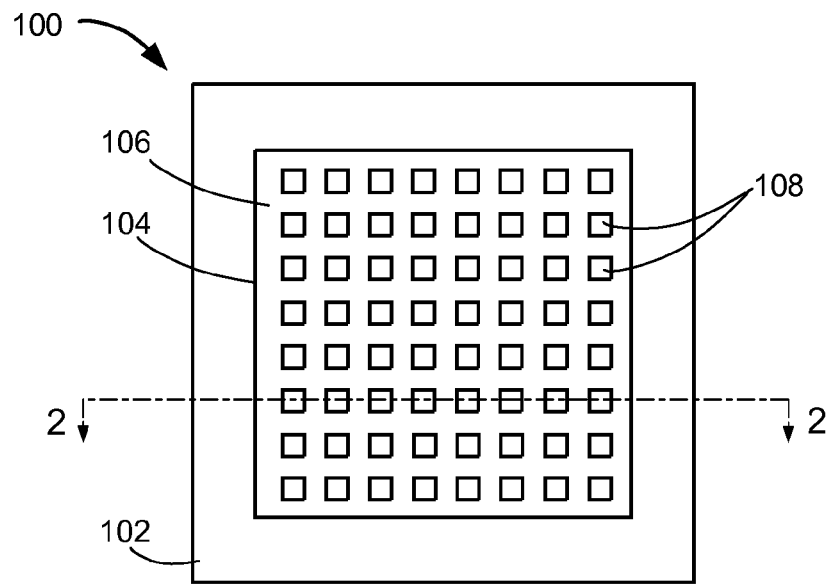
FIG. 1 is a top view of a mountable integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a mountable integrated circuit package system 100 in a first embodiment of the present invention. The top view depicts a package encapsulation 102 of the mountable integrated circuit package system 100 having a recess 104 with a substrate 106 partially exposed within the recess 104. The substrate 106 preferably also includes first external interconnects 108, such as contact pads, for connection to another integrated circuit device.

Figure 2:
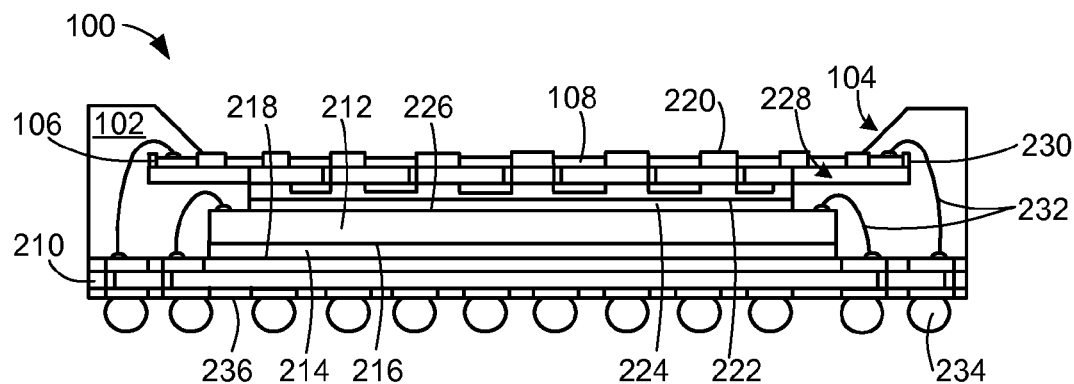
FIG. 2 is a cross-sectional view of the mountable integrated circuit package system along 2-2 of FIG. 1.

Referring now to FIG. 2, therein is shown a cross-sectional view of the mountable integrated circuit package system 100 along 2-2 of FIG. 1. The package encapsulation 102 formed over a carrier 210, such as a substrate, having mounted thereon a first integrated circuit device 212, such as an integrated circuit die, a flip chip, or a packaged integrated circuit device. Preferably, the first integrated circuit device 212 is mounted with a first adhesive 214 such as a die-attach adhesive, with a non-active side 216 of the first integrated circuit device 212 facing a first carrier side 218 of the carrier 210.

The substrate 106 having a first substrate side 220 and a second substrate side 222 opposing the first substrate side 220 is mounted over the first integrated circuit device 212 with a second adhesive 224, such as a nonconductive film, between the second substrate side 222 and an active side 226 of the first integrated circuit device 212. The second substrate side 222 includes a conductor-free recess 228 that extends to a lateral edge 230 of the second substrate side 222. The conductor-free recess 228 is a conductor-free zone with electrically conductive materials, such as solder resist or copper (Cu), removed from the second substrate side 222, such as by masking, grinding, or etching. First electrical interconnects 232, such as bond wires, electrically connect under the conductor-free recess 228 the first carrier side 218 and the active side 226. The first electrical interconnects 232 may also electrically connect the first carrier side 218 and the first substrate side 220.

The package encapsulation 102 covers the first carrier side 218, the first integrated circuit device 212, the second substrate side 222 including the conductor-free recess 228, and the first electrical interconnects 232. The recess 104 in the package encapsulation 102 preferably partially exposes the first external interconnects 108 on the first substrate side 220 for electrical connection to a further integrated circuit device (not shown). Second external interconnects 234, such as solder balls, may attach to a second carrier side 236 of the carrier 210 opposing the first carrier side 218 for electrical connection to the next system level (not shown).

It has been discovered that the present invention reduces package height and improves package reliability with the conductor-free recess in the substrate. The mountable integrated circuit package system 100 having conductor-free recess provides a conductor-free zone for reliable electrical connectivity between integrated circuit device and the carrier while minimizing the bond line thickness between the integrated circuit device and the substrate resulting in the overall height reduction of the integrated circuit packages system. The conductor-free recess accommodates the loop height of electrical interconnects, such as bonding wires, connecting the integrated circuit device to the substrate. The conductor-free recess and the reduced bond line thickness mitigate or eliminate tilting of the substrate improving the reliability of the integrated circuit package system. The substrate having the conductor-free recess may also provide mold lock features reducing delamination of the substrate with the encapsulation and improving moisture sensitivity level (MSL) test results.

Figure 3:
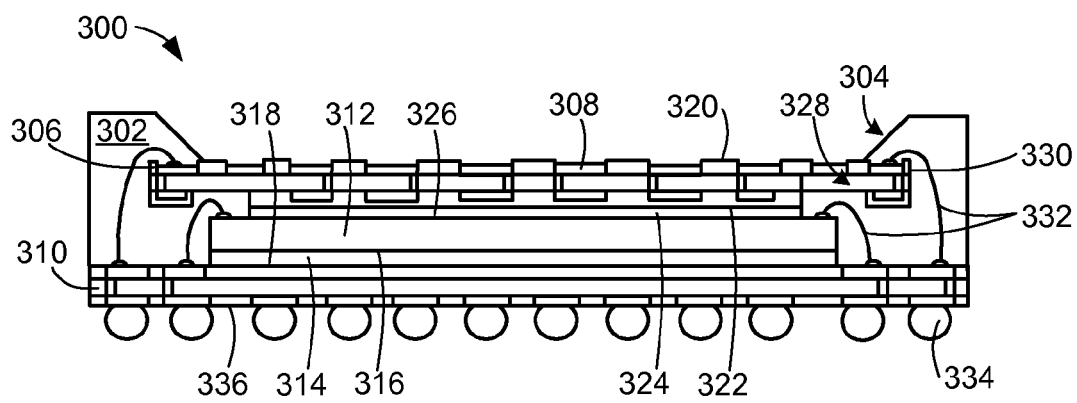
FIG. 3 is a cross-sectional view similar to FIG. 2 of a mountable integrated circuit package system in a second embodiment of the present invention.

Referring now to FIG. 3, therein is shown a cross-sectional view similar to FIG. 2 of a mountable integrated circuit package system 300 in a second embodiment of the present invention. The mountable integrated circuit package system 300 includes structural similarities to the mountable integrated circuit package system 100 of FIG. 2. The cross-sectional view depicts the mountable integrated circuit package system 300 having a package encapsulation 302 formed over a carrier 310, such as a substrate, having mounted thereon a first integrated circuit device 312, such as an integrated circuit die, a flip chip, or a packaged integrated circuit device. Preferably, the first integrated circuit device 312 is mounted with a first adhesive 314 such as a die-attach adhesive, with a non-active side 316 of the first integrated circuit device 312 facing a first carrier side 318 of the carrier 310.

A substrate 306 having a first substrate side 320 and a second substrate side 322 opposing the first substrate side 320 is mounted over the first integrated circuit device 312 with a second adhesive 324, such as a nonconductive film, between the second substrate side 322 and an active side 326 of the first integrated circuit device 312. The second substrate side 322 includes a conductor-free recess 328 that is located away from a lateral edge 330 of the second substrate side 322. Preferably, the location of the conductor-free recess 328 is designated by design needs. The conductor-free recess 328 is a conductor-free zone with electrically conductive materials, such as solder resist or copper (Cu), removed from the second substrate side 322, such as by masking, grinding, or etching. First electrical interconnects 332, such as bond wires, electrically connect under the conductor-free recess 328 the first carrier side 318 and the active side 326. The first electrical interconnects 332 may also electrically connect the first carrier side 318 and the first substrate side 320.

The package encapsulation 302 covers the first carrier side 318, the first integrated circuit device 312, the second substrate side 322, including the conductor-free recess 328, and the first electrical interconnects 332. A recess 304 in the package encapsulation 302 preferably partially exposes first external interconnects 308 on the first substrate side 320 for electrical connection to a further integrated circuit device (not shown). Second external interconnects 334, such as solder balls, may attach to a second carrier side 336 of the carrier 310 opposing the first carrier side 318 for electrical connection to the next system level (not shown).

Figure 4:
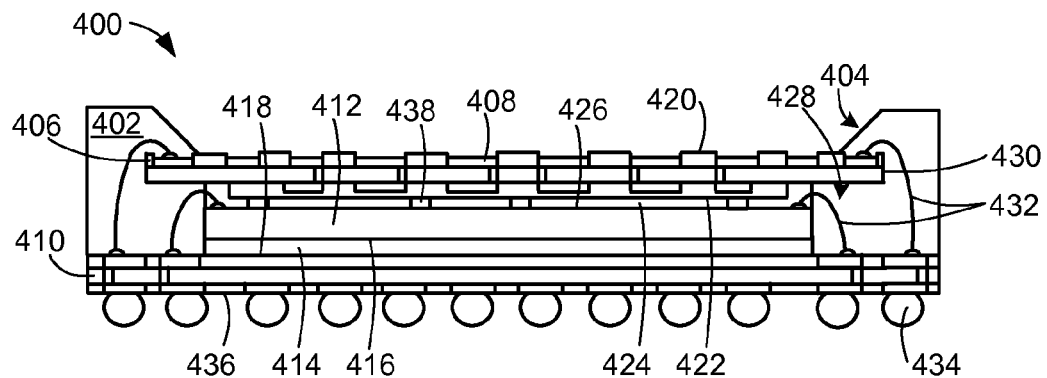
FIG. 4 is a cross-sectional view similar to FIG. 2 of a mountable integrated circuit package system in a third embodiment of the present invention.

Referring now to FIG. 4, therein is shown a cross-sectional view similar to FIG. 2 of a mountable integrated circuit package system 400 in a third embodiment of the present invention. The mountable integrated circuit package system 400 includes structural similarities to the mountable integrated circuit package system 100 of FIG. 2.

The cross-sectional view depicts the mountable integrated circuit package system 400 having a package encapsulation 402 formed over a carrier 410, such as a substrate, having mounted thereon a first integrated circuit device 412, such as an integrated circuit die, a flip chip, or a packaged integrated circuit device. Preferably, the first integrated circuit device 412 is mounted with a first adhesive 414 such as a die-attach adhesive, with a non-active side 416 of the first integrated circuit device 412 facing a first carrier side 418 of the carrier 410.

Spacers 438, such as formed from selectively etching a solder mask layer, are distributed over an active side 426 of the first integrated circuit device 412. A substrate 406 having a first substrate side 420 and a second substrate side 422 opposing the first substrate side 420 is mounted over the first integrated circuit device 412 and the spacers 438 with a second adhesive 424, such as a nonconductive film, between the second substrate side 422 and the active side 426 of the first integrated circuit device 412. The spacers 438 provide additional support to distribute the force of the substrate 406 mounted over the first integrated circuit device 412.

The second substrate side 422 includes a conductor-free recess 428 that is located at a lateral edge 430 of the second substrate side 422 as shown, or optionally away from the lateral edge 430 such as similarly discussed above in FIG. 3. The conductor-free recess 428 is a conductor-free zone with electrically conductive materials, such as solder resist or copper (Cu), removed from the second substrate side 422, such as by masking, grinding, or etching. First electrical interconnects 432, such as bond wires, electrically connect under the conductor-free recess 428 the first carrier side 418 and the active side 426. The first electrical interconnects 432 may also electrically connect the first carrier side 418 and the first substrate side 420.

The package encapsulation 402 covers the first carrier side 418, the first integrated circuit device 412, the second substrate side 422, including the conductor-free recess 428, and the first electrical interconnects 432. A recess 404 in the package encapsulation 402 preferably partially exposes first external interconnects 408 on the first substrate side 420 for electrical connection to a further integrated circuit device. The package encapsulation 402 also preferably provides second external interconnects 434, such as solder balls, on a second carrier side 436 opposing the first carrier side 418 for electrical connection to the next system level.

Figure 5:
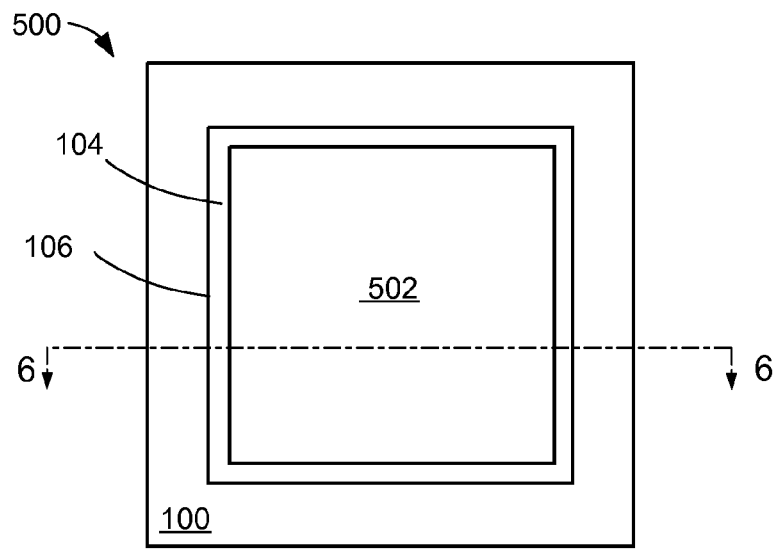
FIG. 5 is a top view of an integrated circuit package-on-package system in an application with the mountable integrated circuit package system of FIG. 2 in a fourth embodiment of the present invention.

Referring now to FIG. 5, therein is shown a top view of an integrated circuit package-on-package system 500 in an application with the mountable integrated circuit package system 100 of FIG. 2 in a fourth embodiment of the present invention. The integrated circuit package-on-package system 500 may be formed with other embodiments of the present inventions, such as the mountable integrated circuit package system 300 of FIG. 3 or the mountable integrated circuit package system 400 of FIG. 4. A mounting integrated circuit device 502, such as a packaged integrated circuit, mounts over the mountable integrated circuit package system 100 of FIG. 1 within the recess 104 and over the substrate 106 of the mountable integrated circuit package system 100 of FIG. 1.

Figure 6:
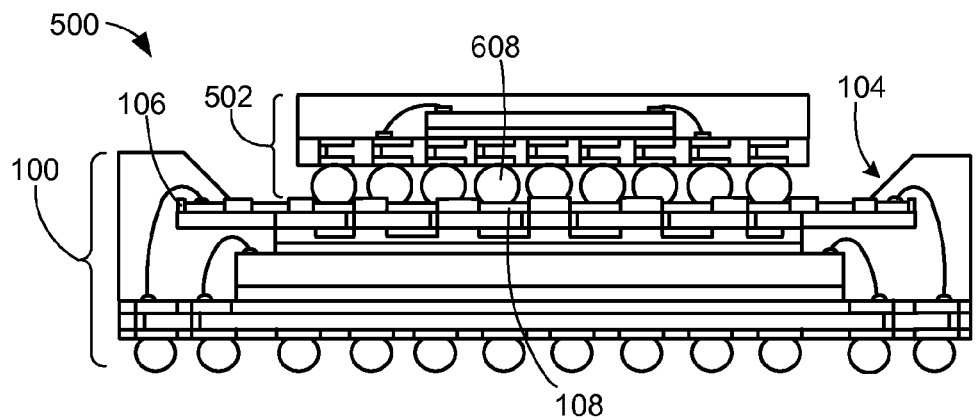
FIG. 6 is a cross-sectional view of the integrated circuit package-on-package system along 6-6 of FIG. 5.

Referring now to FIG. 6, therein is shown a cross-sectional view of the integrated circuit package-on-package system 500 along 6-6 of FIG. 5. The mounting integrated circuit device 502 is mounted over the mountable integrated circuit package system 100, over the substrate 106 exposed within the recess 104 of the mountable integrated circuit package system 100. Preferably third external interconnects 608, such as solder balls, electrically connect the mounting integrated circuit device 502 and the first external interconnects 108 of the mountable integrated circuit package system 100. For illustrative purposes, the integrated circuit package-on-package system 500 is shown with the mounting integrated circuit device 502 as a packaged integrated circuit, although it is understood that the integrated circuit package-on-package system 500 may be formed with different types of integrated circuit for the mounting integrated circuit device 502. For example, the mounting integrated circuit device 502 may include multiple integrated circuits, a quad flat nonleaded (QFN) device, a quad flat package (QFP) device, a bump chip carrier (BCC) device, a flip chip, a passive component, or a combination thereof.

Figure 7:
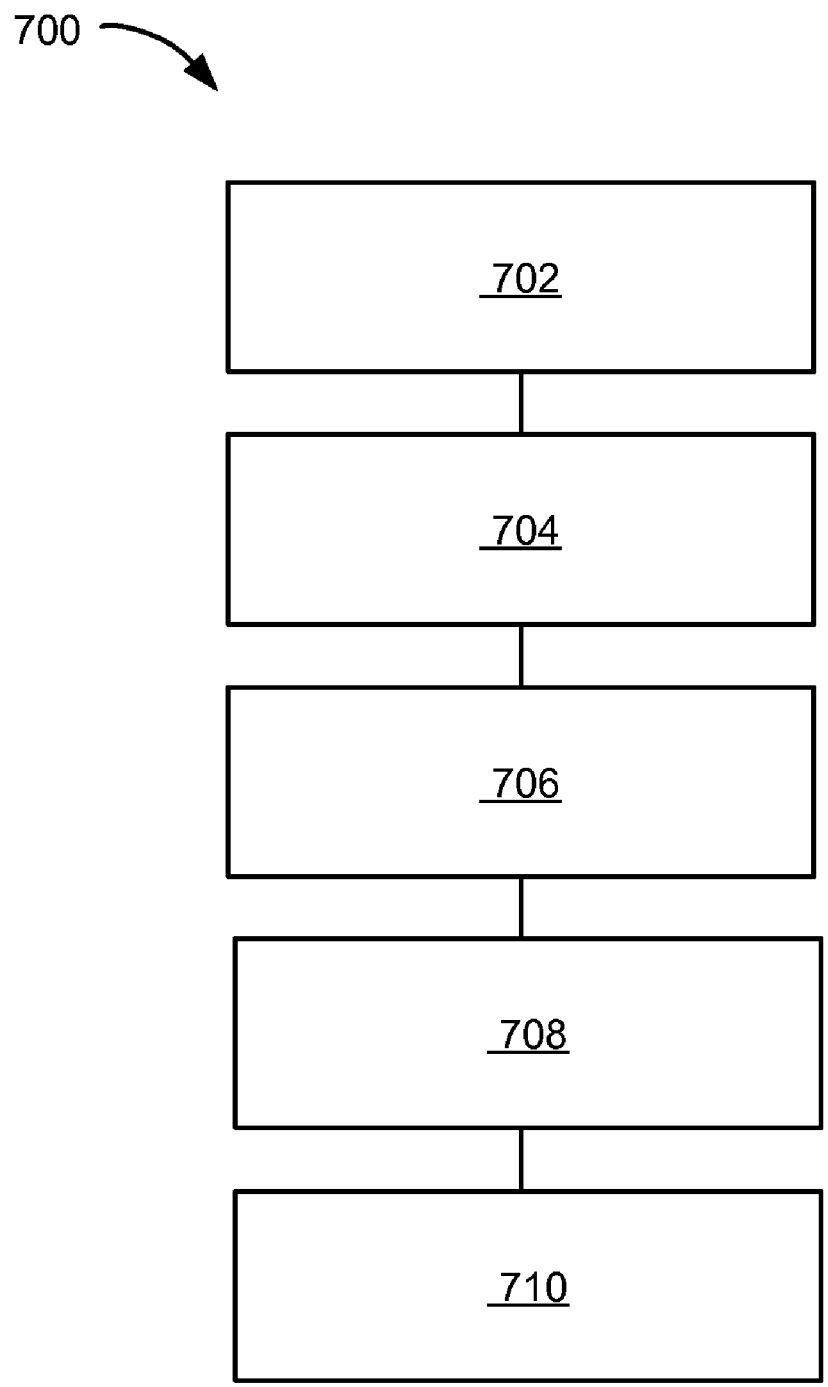
FIG. 7 is a flow chart of a mountable integrated circuit package system for manufacture of the mountable integrated circuit package system in an embodiment of the present invention.

Referring now to FIG. 7, therein is shown a flow chart of a mountable integrated circuit package system 700 for manufacture of the mountable integrated circuit package system 100 in an embodiment of the present invention. The system 700 includes providing a carrier in a block 702; mounting a first integrated circuit device over the carrier in a block 704; mounting a substrate over the first integrated circuit device with the substrate having a conductor-free recess in a block 706; connecting a first electrical interconnect under the conductor-free recess electrically connecting the carrier and the first integrated circuit device in a block 708; and forming a package encapsulation over the carrier, the first integrated circuit device, the first electrical interconnect, the conductor-free recess, and partially exposing the substrate in a block 710.

It has been discovered that the present invention reduces package height and improves package reliability with the conductor-free recess in the substrate. The mountable integrated circuit package system of the present invention having conductor-free recess provides a conductor-free zone for reliable electrical connectivity between integrated circuit device and the carrier while minimizing the bond line thickness between the integrated circuit device and the substrate resulting in the overall height reduction of the integrated circuit packages system. The conductor-free recess accommodates the loop height of electrical interconnects, such as bonding wires, connecting the integrated circuit device to the substrate. The conductor-free recess and the reduced bond line thickness mitigate or eliminate tilting of the substrate improving the reliability of the integrated circuit package system. The substrate having the conductor-free recess may also provide mold lock features reducing delamination of the substrate with the encapsulation and improving moisture sensitivity level (MSL) test results.

Yet other important aspects of the embodiments include that it valuably supports and services the historical trend of reducing costs, simplifying systems, and increasing performance. These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A mountable integrated circuit package system comprising:
   providing a carrier;
   mounting a first integrated circuit device over the carrier;
   mounting a substrate over the first integrated circuit device with the substrate having a conductor-free recess extending to a lateral edge of the substrate;
   connecting a first electrical interconnect under the conductor-free recess electrically connecting the carrier and the first integrated circuit device; and
   forming a package encapsulation over the carrier, the first integrated circuit device, the first electrical interconnect, the conductor-free recess, and partially exposing the substrate.

2. The system as claimed in claim 1 wherein mounting the substrate having the conductor-free recess includes mounting the substrate with the conductor-free recess not to a lateral edge of the substrate.

3. The system as claimed in claim 1 further comprising forming a spacer between the substrate and the first integrated circuit device.

4. The system as claimed in claim 1 further comprising mounting a second integrated circuit device over the substrate.

5. A mountable integrated circuit package system comprising:
   providing a carrier, the carrier having a first carrier side and a second carrier side opposing the first carrier side;
   mounting a first integrated circuit device over the first carrier side, with a non-active side of the first integrated circuit device facing the first carrier side;
   mounting a substrate over the first integrated circuit device, the substrate having a first substrate side and a second substrate side opposing the first substrate side, the second substrate side having a conductor-free recess extending to a lateral edge of the substrate
   connecting a first electrical interconnect under the conductor-free recess for connecting the carrier and an active side of the first integrated circuit device; and
   forming a package encapsulation over the first carrier side, the first integrated circuit device, the first electrical interconnect, the conductor-free recess, and partially exposing the first substrate side.

6. The system as claimed in claim 5 wherein forming the package encapsulation includes exposing a first external interconnect of the substrate.

7. The system as claimed in claim 5 further comprising attaching a second external interconnect to the second carrier side.

8. The system as claimed in claim 5 further comprising connecting a second electrical interconnect between the carrier and the substrate.

9. The system as claimed in claim 5 wherein forming the package encapsulation includes:
   exposing a first external interconnect on the first substrate side; and
further comprising:
   mounting a second integrated circuit device over the first external interconnect.

10. A mountable integrated circuit package system comprising:
    a carrier;
    a first integrated circuit device mounted over the carrier;
    a substrate mounted over the first integrated circuit device with the substrate having a conductor-free recess extending to a lateral edge of the substrate
    a first electrical interconnect under the conductor-free recess connecting the carrier and the first integrated circuit device; and
    a package encapsulation formed over the carrier, the first integrated circuit device, the first electrical interconnect, the conductor-free recess, and partially exposing the substrate.

11. The system as claimed in claim 10 wherein the conductor-free recess extends not to a lateral edge of the substrate.

12. The system as claimed in claim 10 further including a spacer between the substrate and an active side of the first integrated circuit device.

13. The system as claimed in claim 10 further comprising a second integrated circuit device mounted over the substrate.

14. The system as claimed in claim 10 wherein the substrate further includes a first substrate side and a second substrate side opposing the first substrate side, with the conductor-free recess formed on the second substrate side facing an active side of the first integrated circuit device.

15. The system as claimed in claim 14 wherein the package encapsulation exposes a first external interconnect on the first substrate side.

16. The system as claimed in claim 14 further comprising a second external interconnect attached to a second carrier side of the carrier opposing a first carrier side of the carrier.

17. The system as claimed in claim 14 further comprising a second electrical interconnect between the carrier and the substrate.

18. The system as claimed in claim 14 wherein the package encapsulation includes:
    a first external interconnect exposed on the first substrate side; and
    a second integrated circuit device mounted over the first external interconnect.

* * * * *

UNITED STATES PATENT AND TRADEMARK OFFICE
CERTIFICATE OF CORRECTION

| | | |
|---|---|---|
| PATENT NO. | : 8,129,832 B2 | Page 1 of 1 |
| APPLICATION NO. | : 11/927646 | |
| DATED | : March 6, 2012 | |
| INVENTOR(S) | : Carson et al. | |

It is certified that error appears in the above-identified patent and that said Letters Patent is hereby corrected as shown below:

<u>Column 7</u>:
claim 5, line 41, delete "edge of the substrate" and insert therefor --edge of the substrate;--

<u>Column 8</u>:
claim 10, line 17, delete "edge of the substrate" and insert therefor --edge of the substrate;--

Signed and Sealed this
Twenty-fifth Day of September, 2012

David J. Kappos
*Director of the United States Patent and Trademark Office*